(12) United States Patent
Leussler et al.

(10) Patent No.: US 11,194,000 B2
(45) Date of Patent: Dec. 7, 2021

(54) ACTIVE B1+ SHIMMING OF TRANSMISSION COILS

(71) Applicant: KONINKLIJKE PHILIPS N.V., Eindhoven (NL)

(72) Inventors: Christoph Leussler, Hamburg (DE); Peter Vernickel, Hamburg (DE); Oliver Lips, Hamburg (DE); Ingo Schmale, Hamburg (DE); Daniel Wirtz, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/960,107

(22) PCT Filed: Jan. 10, 2019

(86) PCT No.: PCT/EP2019/050517
§ 371 (c)(1),
(2) Date: Jul. 6, 2020

(87) PCT Pub. No.: WO2019/137984
PCT Pub. Date: Jul. 18, 2019

(65) Prior Publication Data
US 2021/0063517 A1 Mar. 4, 2021

(30) Foreign Application Priority Data
Jan. 11, 2018 (EP) ..................................... 18151132

(51) Int. Cl.
*G01R 33/3875* (2006.01)
*G01R 33/24* (2006.01)
(Continued)

(52) U.S. Cl.
CPC ....... *G01R 33/3875* (2013.01); *G01R 33/246* (2013.01); *G01R 33/34092* (2013.01);
(Continued)

(58) Field of Classification Search
CPC ............ G01R 33/246; G01R 33/34092; G01R 33/3628; G01R 33/3875; G01R 33/543; G01R 33/5608; G01R 33/56563
See application file for complete search history.

(56) References Cited

U.S. PATENT DOCUMENTS 6,023,167 A 2/2000 Demeester et al.
10,509,085 B2 12/2019 Leussler et al.
(Continued)

FOREIGN PATENT DOCUMENTS

WO 2008100546 A1 8/2008

OTHER PUBLICATIONS

International Search Report and Written Opinion from PCT/EP2019/050517 dated Apr. 15, 2019.

*Primary Examiner* — Gregory H Curran

(57) ABSTRACT

The invention provides for a magnetic resonance imaging system (100) comprising a radio frequency system (116, 114, 118) configured for acquiring magnetic resonance data (144) from an imaging zone (108). The radio frequency system is configured for sending and receiving radio frequency signals to acquire the magnetic resonance data, wherein the radio frequency system comprises: an elliptical transmission coil (114) configured for generating a B1+ excitation field within the imaging zone; and an active B1 shim coil (118) configured for being placed within the imaging zone, wherein the radio frequency system is configured for suppling radio frequency power to the active B1 shim coil during the generation of the B1+ excitation field by the elliptical transmission coil, wherein the B1 shim coil is configured for shimming the B1+ excitation field within the imaging zone.

19 Claims, 15 Drawing Sheets

(51) Int. Cl.
  *G01R 33/34*   (2006.01)
  *G01R 33/36*   (2006.01)
  *G01R 33/54*   (2006.01)
  *G01R 33/56*   (2006.01)
  *G01R 33/565*  (2006.01)

(52) U.S. Cl.
  CPC ....... *G01R 33/3628* (2013.01); *G01R 33/543* (2013.01); *G01R 33/5608* (2013.01); *G01R 33/56563* (2013.01)

(56) References Cited

U.S. PATENT DOCUMENTS

| | | |
|---|---|---|
| 2010/0164494 A1* | 7/2010 | Koretsky ............... A61K 45/06 |
| | | 324/309 |
| 2012/0032678 A1 | 2/2012 | Vaughan, Jr. et al. |
| 2013/0021033 A1 | 1/2013 | Stoeckel et al. |
| 2013/0127468 A1* | 5/2013 | Biber ................... G01R 33/341 |
| | | 324/322 |
| 2013/0165768 A1 | 6/2013 | Biber |
| 2013/0278262 A1 | 10/2013 | Zhai et al. |
| 2013/0285659 A1 | 10/2013 | Sohn et al. |
| 2014/0077803 A1 | 3/2014 | Biber et al. |
| 2014/0139218 A1 | 5/2014 | Findeklee et al. |
| 2015/0054510 A1* | 2/2015 | Biber ................... G01R 33/445 |
| | | 324/322 |
| 2015/0226820 A1 | 8/2015 | Biber et al. |
| 2018/0246179 A1 | 8/2018 | Zhai et al. |

\* cited by examiner

US 11,194,000 B2

ACTIVE B1+ SHIMMING OF TRANSMISSION COILS

CROSS REFERENCE TO RELATED APPLICATIONS

This application is a U.S. national phase application of International Application No. PCT/EP2019/050517 filed on Jan. 10, 2019, which claims the benefit of EP Application Serial No. 18151132.0 filed on Jan. 11, 2018 and is incorporated herein by reference.

FIELD OF THE INVENTION

The invention relates to magnetic resonance imaging, in particular to the shimming of the B1+ excitation field of transmission coils.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Atoms have a magnetic moment and a portion of them will align with the B0 field. A radio frequency system can be used to generate a radio-frequency B1+ excitation field that is able to move some of these atoms with a magnetic moment out of alignment with the B0 field where they begin to process. Gradient magnetic fields can further manipulate these atoms in a spatially selective manner. The emitted radio frequency signals can be digitized and recorded. Fourier techniques then enable spatially resolved magnetic resonance images to be constructed from these recordings. The homogeneity of the B1+ excitation field is one factor which determines the quality of a magnetic resonance image.

U.S. Pat. No. 6,023,167 discloses a localized shim coil for use in a magnetic resonance imaging system includes a plurality of conductive elements. The conductive elements are connected to a current source. The conductive elements are arranged adjacent to a localized region of a subject being imaged such that current flowing through the conductive elements generates a localized magnetic field. A plurality of series-connected choke and resistor pairs, respectively, are connected to the plurality of conductive elements. The chokes present a high impedance to currents having frequencies substantially the same as the resonant frequency of the magnetic resonance imaging system. The resistors balance the current flowing through each conductive element. The localized magnetic field is generated such that it is substantially equal and opposite to localized non-uniformities generated in the magnetic resonance system's main magnetic field by the subject's geometric shape and magnetic susceptibility in the localized region being imaged.

SUMMARY OF THE INVENTION

The invention provides for a magnetic resonance imaging system in the independent claims. Embodiments are given in the dependent claims.

When an elliptical transmission coil, such as a cylindrical bird cage coil, is used to generate the B1+ excitation field there may be difficulties in generating the B1+ excitation field with high uniformity. This may be true even if the elliptical transmission coil has multiple input ports or channels. Embodiments of the invention may use an active B1 shim coil to improve the uniformity of the B1+ excitation field. An elliptical transmission coil as used here encompasses a transmission coil with an elliptical cross section. An active B1 shim coil as used herein encompasses a B1 shim coil that is actively supplied with Radio Frequency (RF) power.

In one aspect, the invention provides for a magnetic resonance imaging system comprising a radio-frequency system configured for acquiring magnetic resonance data from an imaging zone. The magnetic resonance imaging system may comprise a magnet or main magnet which generates a magnetic field region which is sufficiently strong and uniform for performing magnetic resonance imaging. This area of sufficient field strength and uniformity is the imaging zone. The radio-frequency system is configured for sending and receiving radio-frequency signals to acquire the magnetic resonance data. The radio-frequency system comprises an elliptical transmission coil configured for generating a B1+ excitation field within the imaging zone. The radio-frequency system further comprises an active B1 shim coil configured for being placed within the imaging zone. In some instances the active B1 shim coil may be permanently mounted or fixed to the magnetic resonance imaging system such as to the elliptical transmission coil or to a subject support.

The radio-frequency system is configured for supplying radio-frequency power to the active B1 shim coil during the generation of the B1+ excitation field by the elliptical transmission coil. The B1 shim coil is configured for shimming the B1+ excitation field within the imaging zone. This embodiment has the advantage that the active B1 shim coil makes the B1+ excitation field more uniform and therefore provides higher quality magnetic resonance images.

The elliptical transmission coil could also be a circular transmission coil. A circular transmission coil as used herein is a transmission coil that has a circular cross section. The circular transmission coil may be shaped like a cylinder. The circular transmission coil may also be referred to as a cylindrical transmission coil The elliptical transmission coil may take different forms in different examples. In one example, the elliptical transmission coil is a body coil which is attached to the magnetic resonance imaging magnet assembly. In other examples the elliptical transmission coil could be a coil which is used for imaging an extremity such as a head, leg, or arm. The elliptical transmission coil may or may not be fixed to the magnetic resonance imaging system depending upon different examples of embodiments.

In another embodiment, the radio-frequency system further comprises a connection for a local receive coil. The active B1 shim coil comprises a tuning circuit for switching the B1 active shim coil between the tuned state and an untuned state. The magnetic resonance imaging system further comprises a memory for storing machine-executable instructions. The magnetic resonance imaging system further comprises a processor for controlling the magnetic resonance imaging system. Execution of the machine-executable instructions causes the processor to control the tuning circuit to place the active B1 shim coil in the tuned state when the elliptical transmission coil is generating the active B1+ excitation field during acquisition of the magnetic resonance data. Execution of the machine-executable instructions further causes the processor to control the tuning circuit to place the active B1 shim coil to an untuned state when the connection for the local receive coil is configured for receiving radio-frequency signals during acquisition of the magnetic resonance data. This embodiment is beneficial because switching the active B1 shim coil between a tuned and untuned state reduces the coupling between the active B1 shim coil and any local receive coil.

The local receive coil may take different forms in different examples. It may for example be a coil which is placed or located adjacent to the subject.

In another embodiment, the memory further contains pulse sequence commands configured for acquiring the magnetic resonance data according to a magnetic resonance imaging protocol. Execution of the machine-executable instructions further cause the processor to control the magnetic resonance imaging system with pulse sequence commands to acquire the magnetic resonance data.

Execution of the machine-executable instructions may also cause the processor to reconstruct a magnetic resonance image from the magnetic resonance data and also in some examples to store or display the resulting magnetic resonance image.

In another embodiment, the radio-frequency system is configured for adjusting an amount of radio-frequency power and/or phase supplied to the active B1 shim coil. This may be beneficial because it may provide for improved shimming of the B1+ excitation field.

In another embodiment, the active B1 shim coil comprises a magnetic field sensor. Execution of the machine-executable instructions further cause the processor to control the magnetic resonance imaging system to generate a test B1 field using the elliptical transmission coil. Execution of the machine-executable instructions further causes the processor to measure a magnetic field strength during the generation of the test B1 field with the magnetic field sensor. Execution of the machine-executable instructions further cause the processor to calculate an active B1 shim coil calibration using the magnetic field strength. The radio-frequency system is configured for adjusting the amount of radio-frequency power supplied to the active B1 shim coil using the active B1 shim coil calibration. This embodiment may be beneficial because it may enable the calibration of the active B1 shim coil for a particular subject and it may be done without performing an imaging protocol.

In another embodiment, the magnetic field sensor is a separate sensor from the active B1 shim coil.

In another embodiment, the magnetic field sensor is formed at least partially from the active B1 shim coil. For example, a loop or portion of the active B1 shim coil may be used as a sensor. In one example, the magnetic field sensor is formed by measuring the amount of power coupling from the elliptical transmission coil to the active B1 shim coil.

In another embodiment, the B1 shim coil is a loop coil.

In another embodiment, the B1 shim coil is a "figure 8" coil.

In another embodiment, the B1 shim coil is a dipole antenna.

In another embodiment, the B1 shim coil is a folded dipole antenna.

In another embodiment, the B1 shim coil is a helical dipole antenna.

In another embodiment, the B1 shim coil is located in a central region of the imaging zone. Placing the B1 shim coil in a central region of the imaging zone may be beneficial because it may be positioned further away from the elliptical transmission coil and thereby reduce the amount of coupling.

In another embodiment, the B1 shim coil is located in or attached to the elliptical transmission coil.

In another embodiment, the active B1 shim coil is located in a subject mattress.

In another embodiment, the active B1 shim coil is located in a subject garment which the subject is able to wear.

In another embodiment, the active B1 shim coil is located in a subject support. When the active B1 shim coil is located in the subject support it may be either located in a portion of the subject support which moves in and out of the magnet or it could be permanently fixed with respect to its position within the magnet.

In another embodiment, the magnetic resonance imaging system comprises a main magnet configured for generating a main magnetic field in the imaging zone. The active B1 shim coil is aligned with the magnetic field lines of the main magnetic field. For example if the main magnet is a cylindrical magnet the magnetic field lines may be aligned with the z-axis of the magnet. The active B1 shim coil may be aligned such that its main or longest dimension is aligned with the z-axis or the magnetic field lines. This may have the advantage that it may be useful for aligning with anatomical structures such as the spine, a leg, arm or other extremity which are difficult to image with an elliptical transmission coil.

In another embodiment, the radio-frequency system comprises multiple transmit channels connected to the elliptical transmission coil. For example it is very typical that with a cylindrical birdcage coil there are two modes which the radio-frequency power is coupled to. These two modes may be used to provide some adjustment to the radio-frequency power supplied to the elliptical transmission coil. Other elliptical transmission coils such as a TEM or other type of coil may also have more than one port for supplying radio-frequency power.

In another embodiment, the radio-frequency system comprises radio-frequency couplers connected to the multiple transmit channels for supplying radio-frequency power to the active B1 shim coil. This embodiment may have the benefit that additional transmit channels may not be needed to incorporate the active B1 shim coil into the magnetic resonance imaging system.

In another embodiment, the elliptical transmission coil is a body coil.

In another embodiment, the elliptical transmission coil is a head coil.

In another embodiment, the elliptical transmission coil is a cylindrical transmission coil.

In another embodiment, the elliptical transmission coil is a birdcage coil.

In another embodiment, the elliptical transmission coil is a z-segmented combination of body coils.

In another embodiment, the elliptical transmission coil is a TEM coil.

In another embodiment, the magnetic resonance imaging system further comprises one or more resonant coupling coils for further shimming the B1+ excitation field within the imaging zone. This embodiment may be beneficial because the addition of the resonant coupling coils may further enhance the proper shimming of the B1+ excitation field.

In another embodiment, the magnetic resonance imaging system further comprises one or more dielectric pads for further shimming the B1+ excitation field. This embodiment may be beneficial because the addition of the dielectric pads may further improve the shimming of the B1+ excitation field.

It is understood that one or more of the aforementioned embodiments of the invention may be combined as long as the combined embodiments are not mutually exclusive.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. A Magnetic Resonance Imaging (MRI) image or MR image is defined herein as being the reconstructed two or three dimensional visualization of anatomic data contained within the magnetic resonance data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
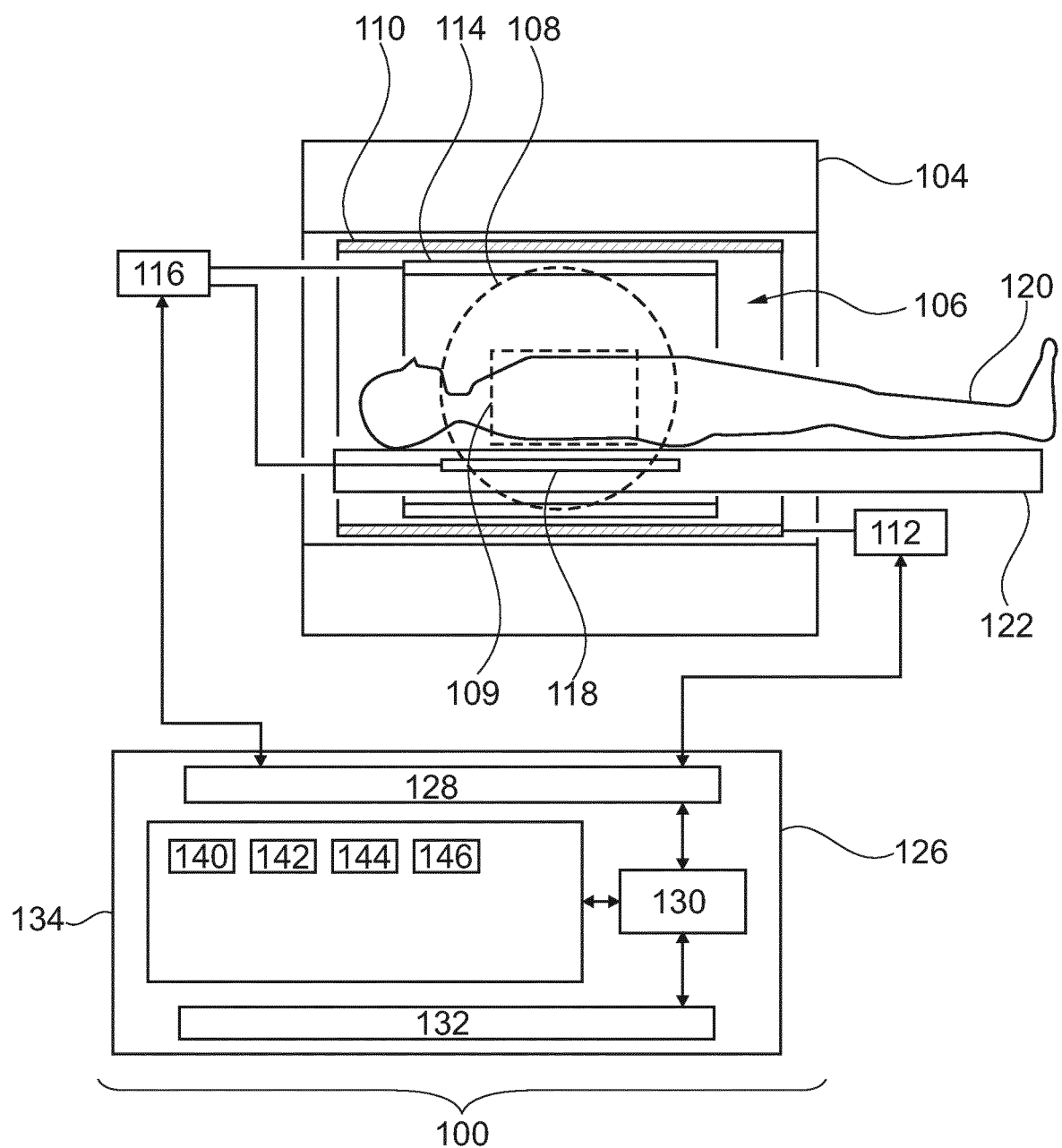
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet Such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. The magnetic resonance data is acquired typically for the region of interest. A subject 120 is shown as being supported by a subject support 122 such that at least a portion of the subject 120 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Within the bore 106 of the magnet 104 there is an elliptical transmission coil 114. In this particular example the elliptical transmission coil 114 is a cylindrical body coil. Although a cylindrical body coil 114 is depicted in FIG. 1 it could be replaced with an elliptical body coil or a local coil for imaging the head, an arm, leg or other extremity. The elliptical transmission coil 114 is shown as being connected to a transceiver 116. There may be connections between the transceiver 116 and one or more ports 114 on the elliptical transmission coil.

Within the subject support 122 there is an active B1 shim coil 118. The active B1 shim coil 118 is located within a central region of the imaging zone 108. The B1 active shim coil 118 is located within the subject support 122 and the spinal region of the subject 120 is approximately over the location of the active B1 shim coil 118. This may assist in the imaging of portions of the subject 120 adjacent to the spine. Similar positioning of the subject for the head, legs, arms or other extremities may also be imaged in this fashion.

The B1 active shim coil 118 is shown as being connected to the transceiver 116. The transceiver is adapted for providing radio frequency power to the active shim coil 118. In some examples the transceiver is adapted for controlling the radio frequency power and phase of the radio frequency power supplied to the B1 active shim coil.

The transceiver 116 and the gradient controller 112 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium.

The memory 134 is shown as containing machine-executable instructions 140. The machine-executable instructions 140 enable the processor 130 to control the operation and function of the magnetic resonance imaging system 100. The machine-executable instructions 140 may also enable the processor 130 to perform various data analysis and calculation functions. The computer memory 134 is further shown as containing pulse sequence commands 142. The pulse sequence commands are configured for controlling the magnetic resonance imaging system 100 to acquire magnetic resonance data from the subject 118.

The computer memory 134 is further shown as containing magnetic resonance data 144 that was acquired by controlling the magnetic resonance imaging system 100 with the pulse sequence commands 142. The pulse sequence commands 142 control the magnetic resonance imaging system 100 such that when the elliptical transmission coil 114 is producing the B1+ excitation field the transceiver 116 also supplies power directly to the active B1 shim coil 118. This may provide a more uniform B1+ excitation field when the magnetic resonance data 144 is acquired. The memory 134 is further shown as containing the magnetic resonance image 146 that was reconstructed from the magnetic resonance data 144. The machine-executable instructions 140 may for example have program instructions which enable the processor 130 to perform this task.

The location of the active B1 shim coil 118 could be different in different examples. For example the active B1 shim coil 118 could also be located in a cushion supporting the subject 120, or on or in a garment the subject 120 is wearing. So the active B1 shim coil(s) can surround the subject, with e.g. a circular or elliptic cross-section, or not surround the subject (or parts of its), e.g. they could just be adjacent to the subject, with e.g. a planar realization directly below the subject.

In some examples the active B1 shim coil(s) can even be mounted to the elliptical transmission coil 114. This despite the fact, that it is typically considered an advantage to have the active B1 shim coil 118 away from the elliptical transmission coil 114 since it may reduce the amount of coupling between the active B1 shim coil and the elliptical transmission coil 114.

When the active B1 shim coil 118 is mounted in the subject support 122 it may be mounted on a pedestal such that the active B1 shim coil 118 is always in a fixed location with respect to the magnet 104. In other examples the active B1 shim coil 118 may be incorporated or integrated into a moveable portion of the subject support 122 and may for example move into the bore of the magnet 106 when the subject 120 is moved. This may be advantageous because particular portions of the subject's anatomy can be placed directionally or preferentially over the active B1 shim coil 118.

Figure 2:
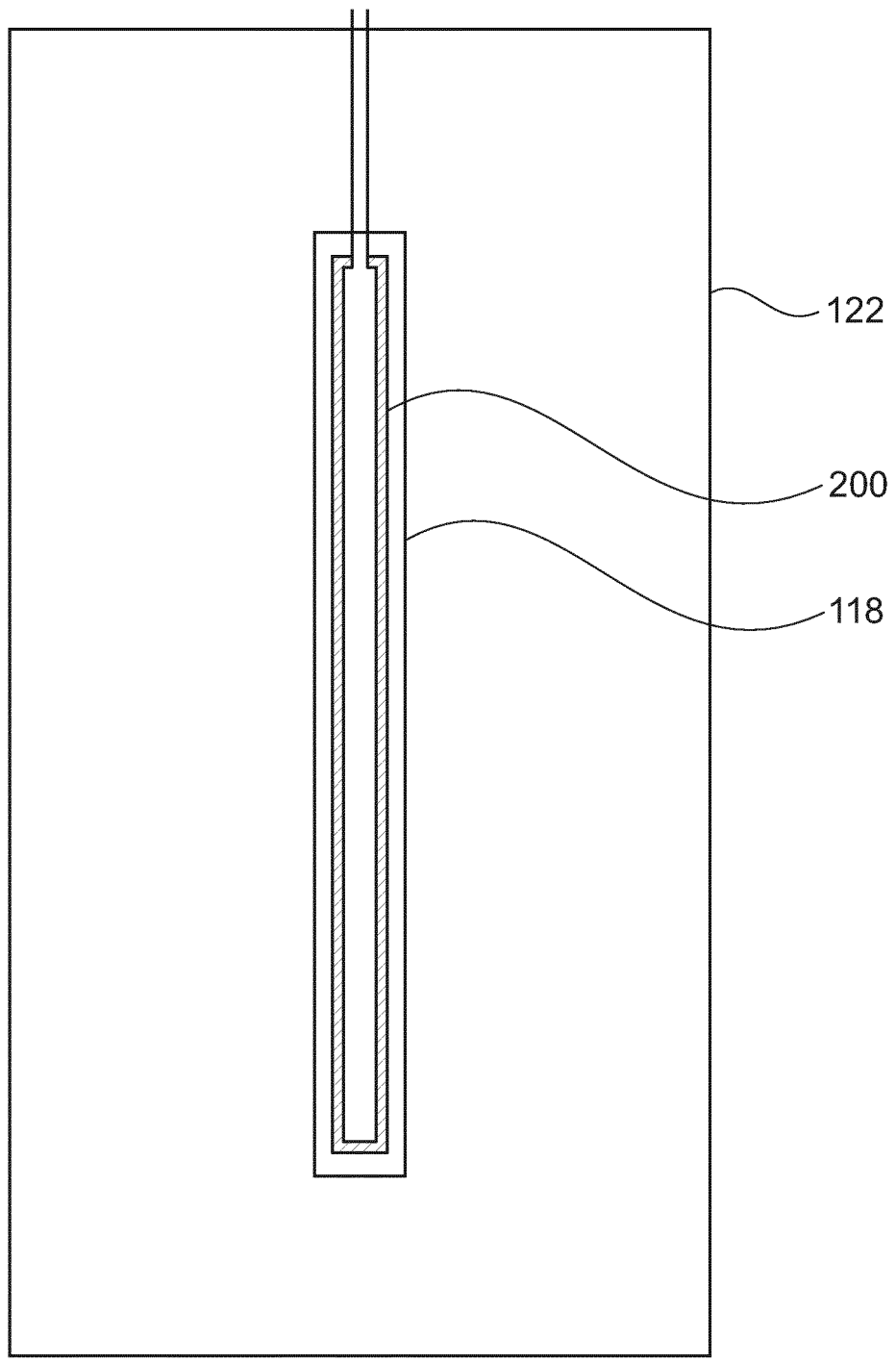
FIG. 2 illustrates an example of an active B1 shim coil.

FIG. 2 illustrates an implementation of the active B1 shim coil 118. A top view of the subject support 122 is shown. The active B1 shim coil 118 is embedded within the subject support 122. The active B1 shim coil 118 is shown as being or comprising a loop coil 200. In some examples the active B1 shim coil 118 may comprise more than one loop coil 200.

Figure 3:
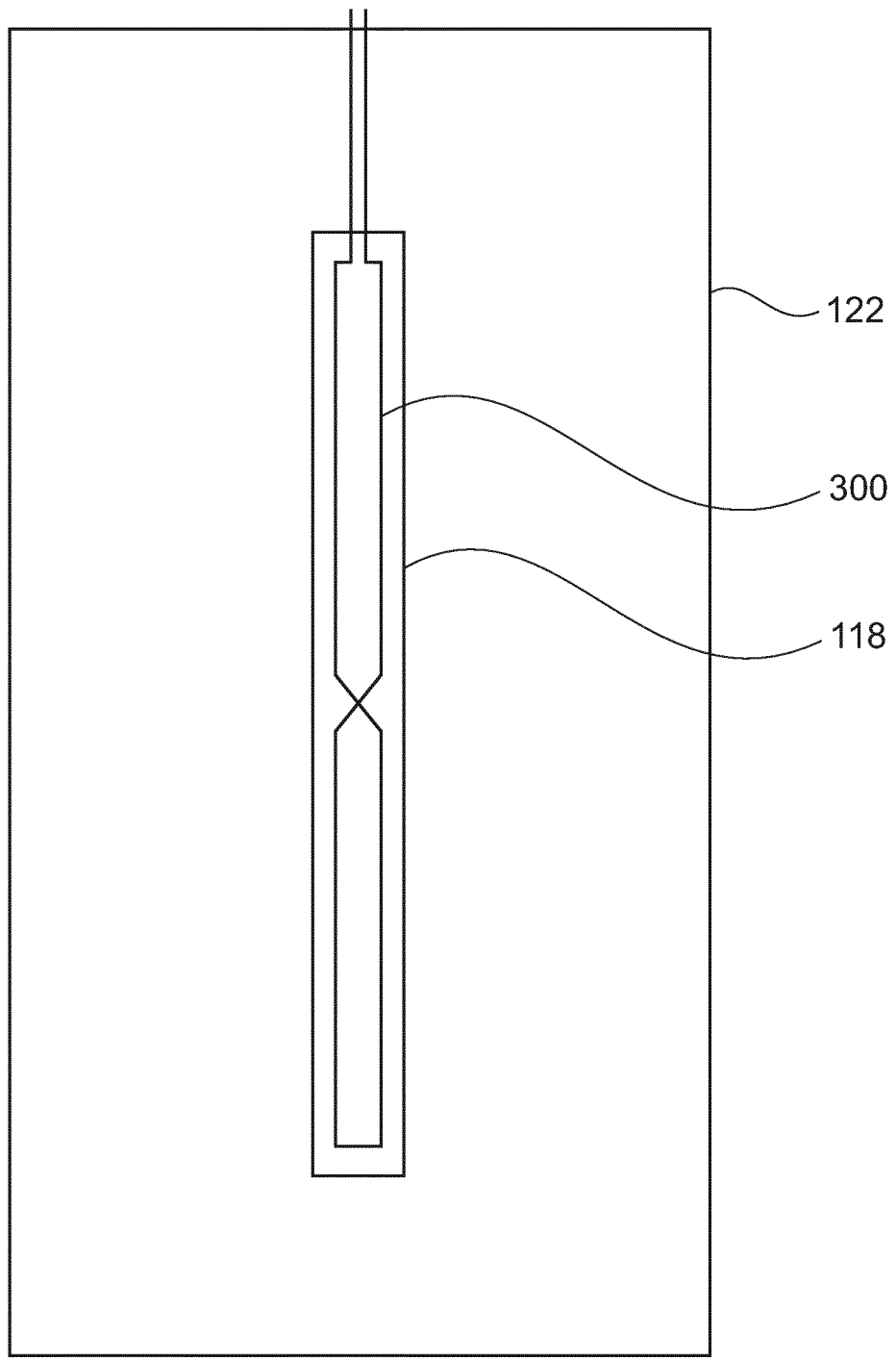
FIG. 3 illustrates a further example of an active B1 shim coil.

FIG. 3 shows a further example of an implementation of the active B1 shim coil 118. In this example the subject support 122 is again shown from a top view. The active B1 shim coil 118 is shown as comprising a "figure 8" coil 300. In some examples the active B1 shim coil 118 may comprise more than one "figure 8" coil 300.

Figure 4:
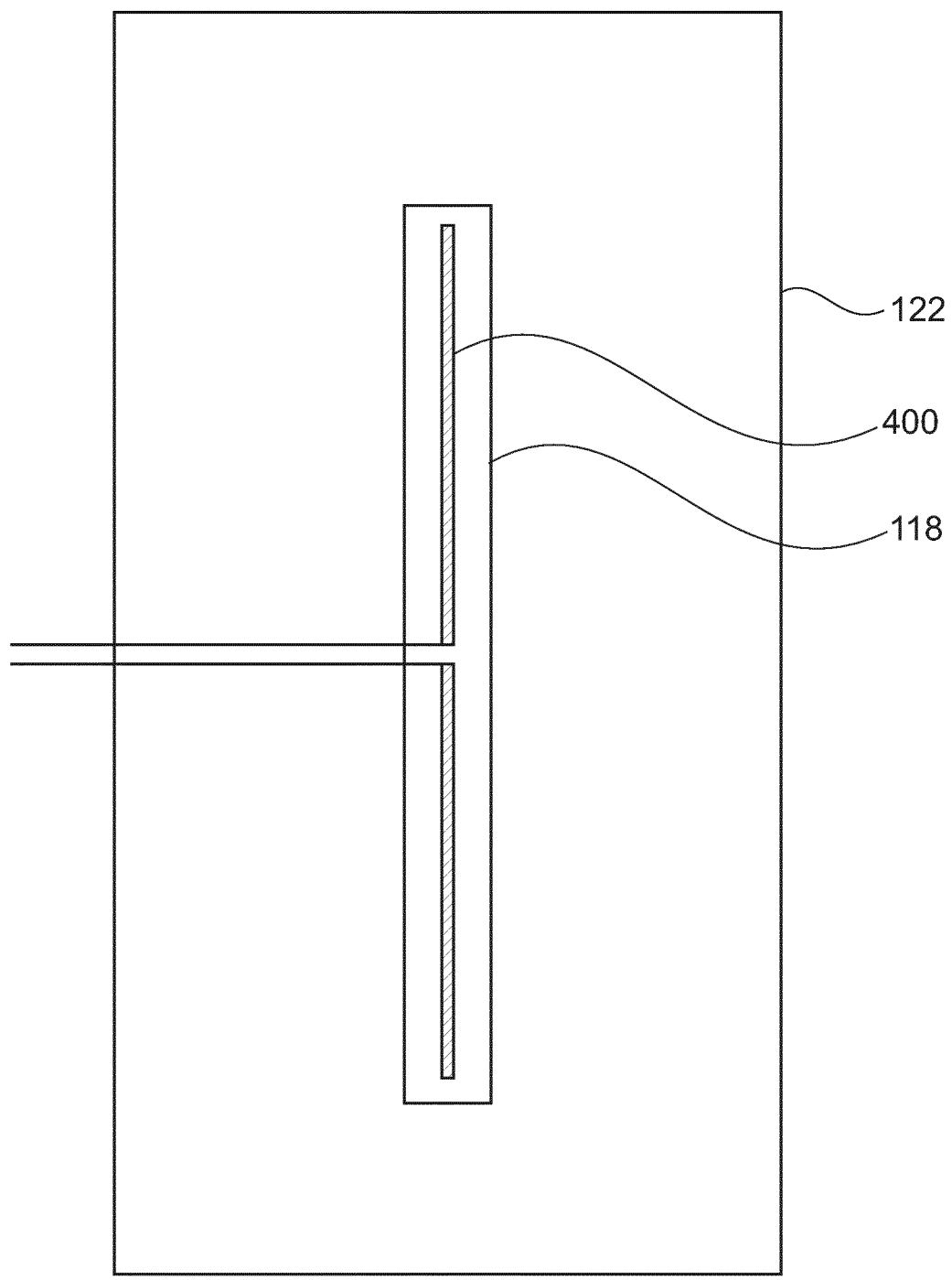
FIG. 4 illustrates a further example of an active B1 shim coil.

FIG. 4 shows a further example of an implementation of the active B1 shim coil 118. Again, a top view of a subject support 122 is shown. In this example the active B1 shim coil 118 is shown as being or comprising a dipole antenna 400. In other examples the active B1 shim coil 118 may comprise more than one dipole antenna 400.

Figure 5:
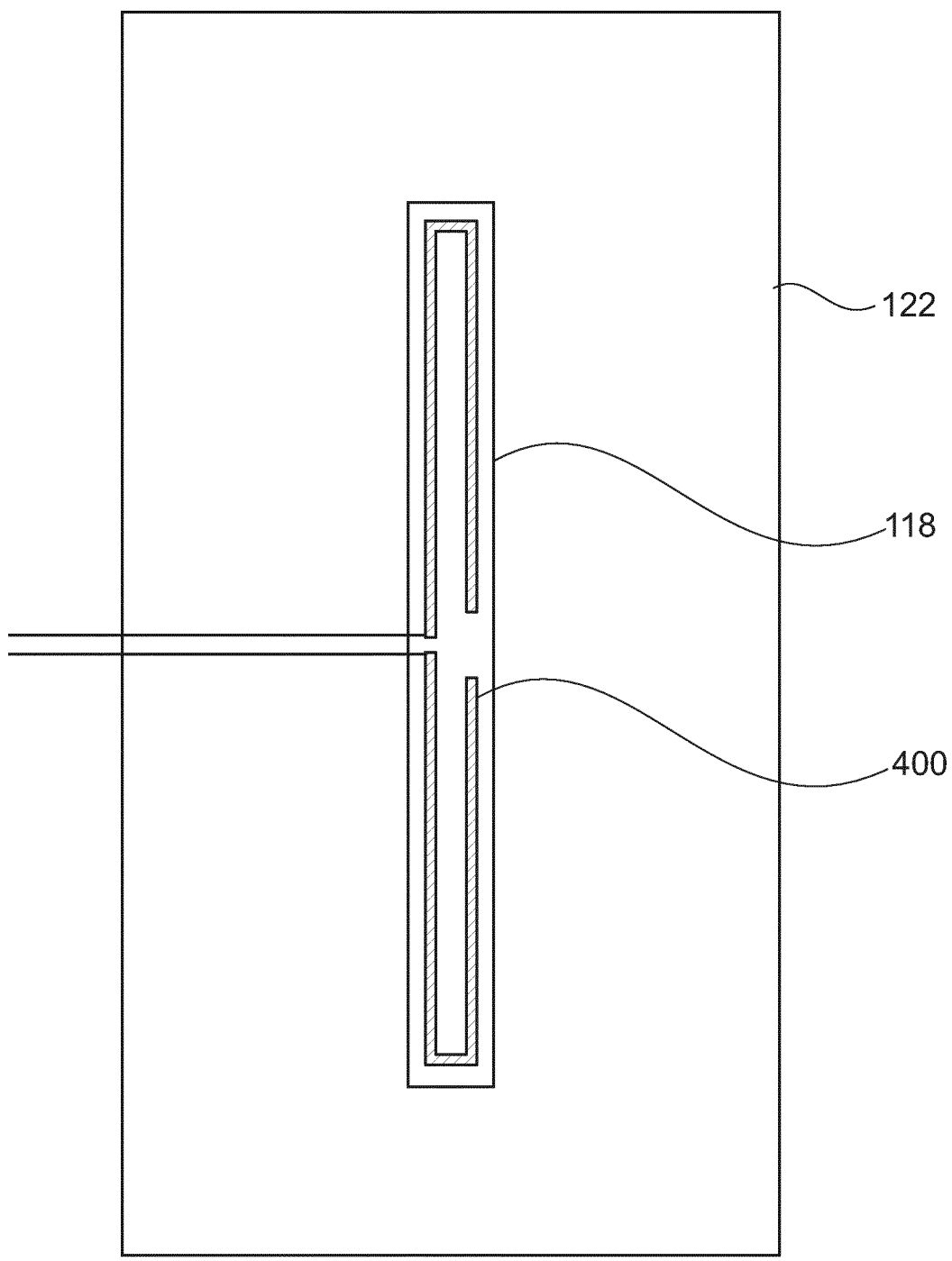
FIG. 5 illustrates a further example of an active B1 shim coil.

FIG. 5 shows a further example of an implementation of the active B1 shim coil 118. Again, in this example a top view of a subject support 122 is shown. The active B1 shim coil 118 is shown as comprising a folded dipole antenna 500. In some examples the active B1 shim coil 118 may comprise more than one folded dipole antenna 500. In some examples the ends of the folded dipoles may be capacitively coupled. This may assist in properly tuning the folded dipole antenna 500.

Figure 6:
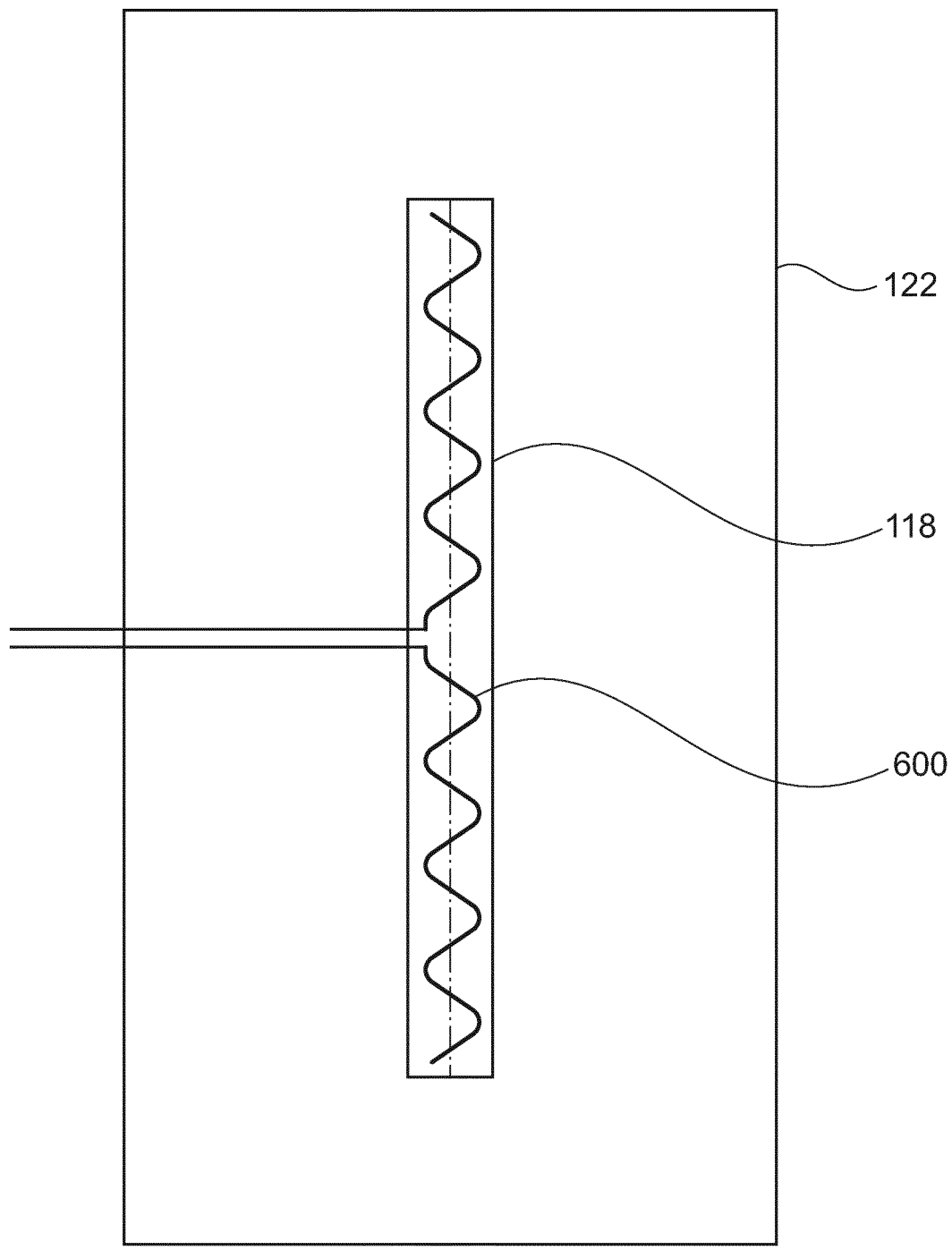
FIG. 6 illustrates a further example of an active B1 shim coil.

FIG. 6 shows a further example of an implementation of the active B1 shim coil 118. Again, in this example a top view of a subject support 122 is shown. The active B1 shim coil 118 is shown as comprising a helical dipole antenna 600. An advantage of using a helical dipole antenna 600 is that the active B1 shim coil 118 may be manufactured more compactly in comparison to a normal dipole antenna. In some examples the active B1 shim coil 118 comprises more than one helical dipole antenna 600.

Figure 7:
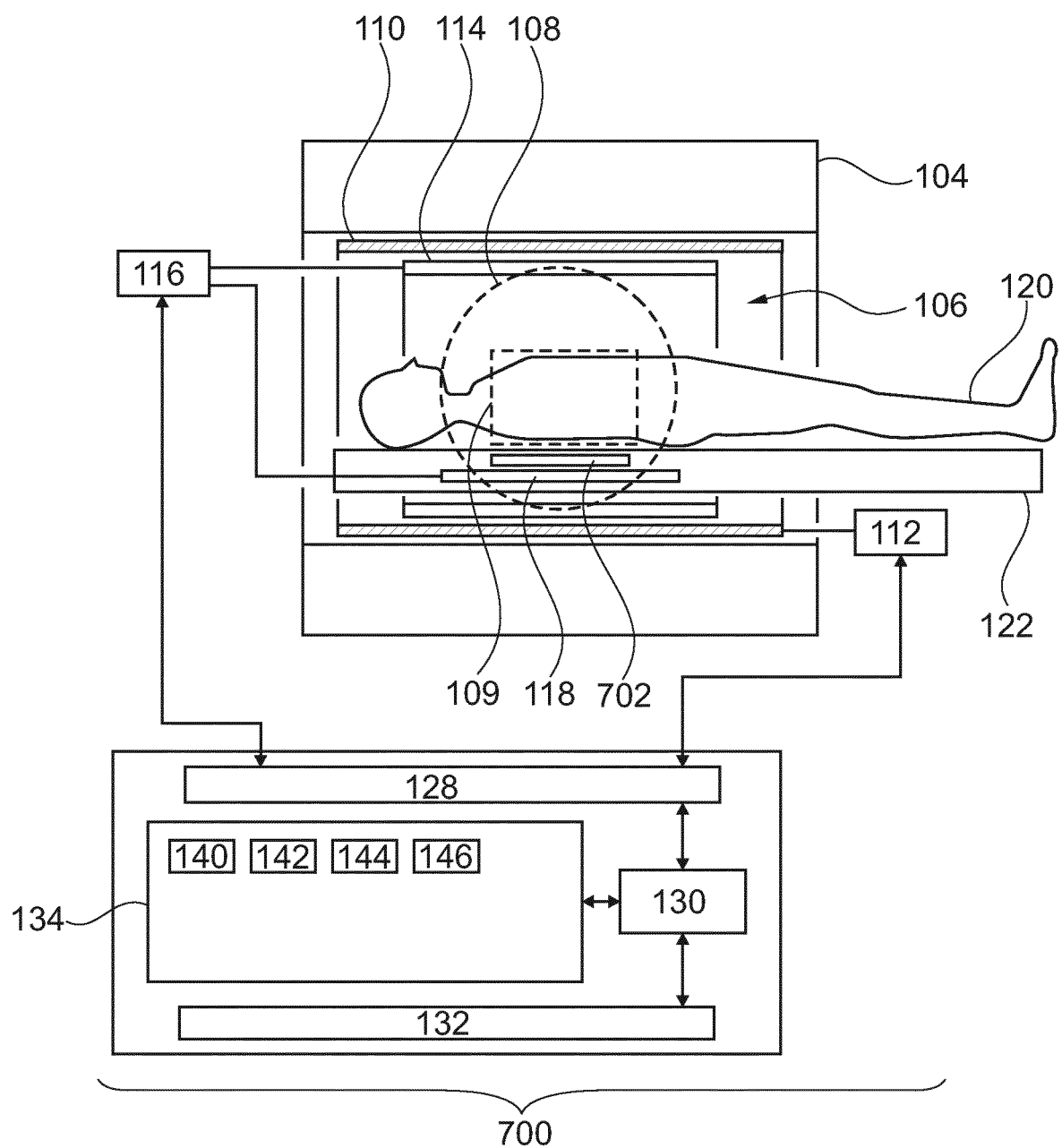
FIG. 7 illustrates a further example of a magnetic resonance imaging system.

FIG. 7 shows a further example of a magnetic resonance imaging system 700. The magnetic resonance imaging system 700 shown in FIG. 1 is similar to the magnetic resonance imaging system 100 of FIG. 1 except the subject support 122 is additionally shown as comprising a passive B1 shimming element 702. The passive B1 shimming element for example may be one or more resonant coupling coils for further shimming the B1+ excitation field. The one or more resonant coupling coils may also have a circuit for placing them in a tuned or untuned state. The effect of the one or more resonance coupling coils on the B1+ excitation field may therefore be selectively controlled. The one or more resonant coupling coils may also be detuned during the acquisition of magnetic resonance signals to reduce the chance that the one or more resonant coupling coils couple to a receive coil or antenna.

The passive B1 shimming element 702 may also comprise one or more dielectric pads also for further shimming the B1+ excitation field. The passive B1 shimming element 702 is shown as being between the imaging zone 109 and the active B1 shim coil. The addition of the passive B1 shimming element 702 may further improve the shimming of the B1+ excitation field.

Figure 8:
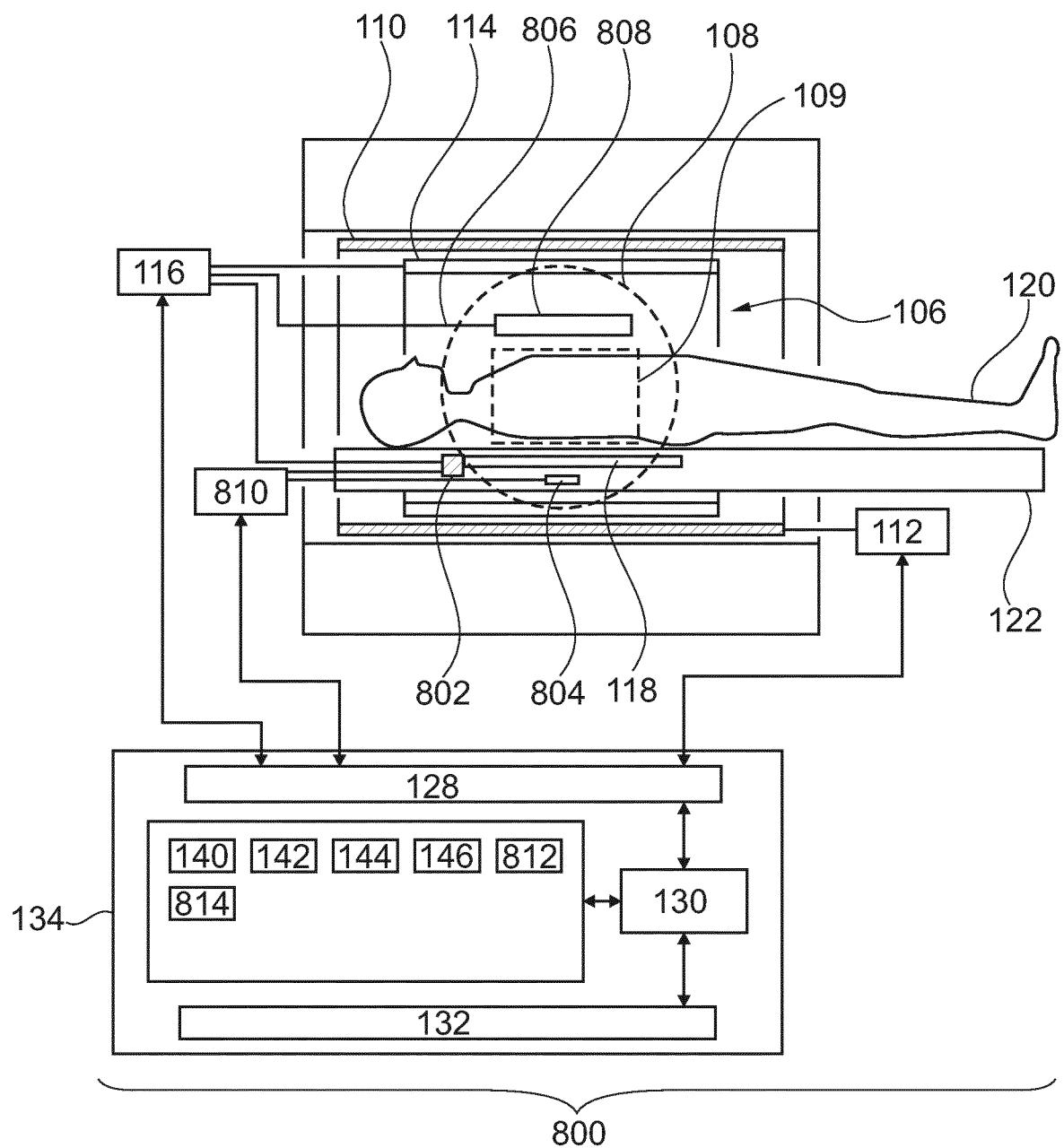
FIG. 8 illustrates a further example of a magnetic resonance imaging system.

FIG. 8 illustrates a further example of a magnetic resonance imaging system 800. The magnetic resonance imaging system 800 in FIG. 8 is similar to the magnetic resonance imaging system 1 in FIG. 1 with a number of additions. The active B1 shim coil 118 is further shown as comprising a tuning circuit 802 for placing the active B1 shim coil into a tuned and untuned state. The subject support 122 is further shown as containing or comprising a magnetic field sensor 804 that is adjacent to the active B1 shim coil 118. In some examples the magnetic field sensor 804 is incorporated into or comprises or is partially formed from the active B1 shim coil 118. The radio-frequency system 116 is shown as containing at least one connection for a local receive coil 808. For example the local receive coil 808 may be a surface coil or other coil which is placed or located adjacent to the subject 120.

The local receive coil 808 may contain multiple coil elements. The local receive coil 808 may also be referred to as a channel or antenna. The local receive coil 808 is connected to the radio frequency transceiver 116. If a parallel imaging technique such as SENSE is performed, the local receive coil 808 has multiple coil elements.

The magnetic resonance imaging system 800 is further shown as containing a controller 810 for the active B1 shim coil. The controller 810 for example may be used to control the tuning circuit 802 and/or to receive data from the magnetic field sensor 804. In the arrangement shown in FIG. 8 the transmission of radio-frequency signals may be performed using the elliptical transmission coil 114. When the elliptical transmission coil 114 is generating the B1+ excitation field, the tuning circuit 802 places the active B1 shim coil 118 into the tuned state and radio-frequency power is supplied to the active B1 shim coil 118. When the generation of the B1+ excitation field is finished, the tuning circuit 802 can place the active B1 shim coil 118 into an untuned state so that it does not couple with the local receive coil 808.

The memory 134 is further shown as containing a magnetic field strength measurement 812 that was made using the magnetic field sensor 804. The memory 134 is further shown as containing an active B1 shim coil calibration 814 that was calculated using the magnetic field strength measurement 812.

Figure 9:
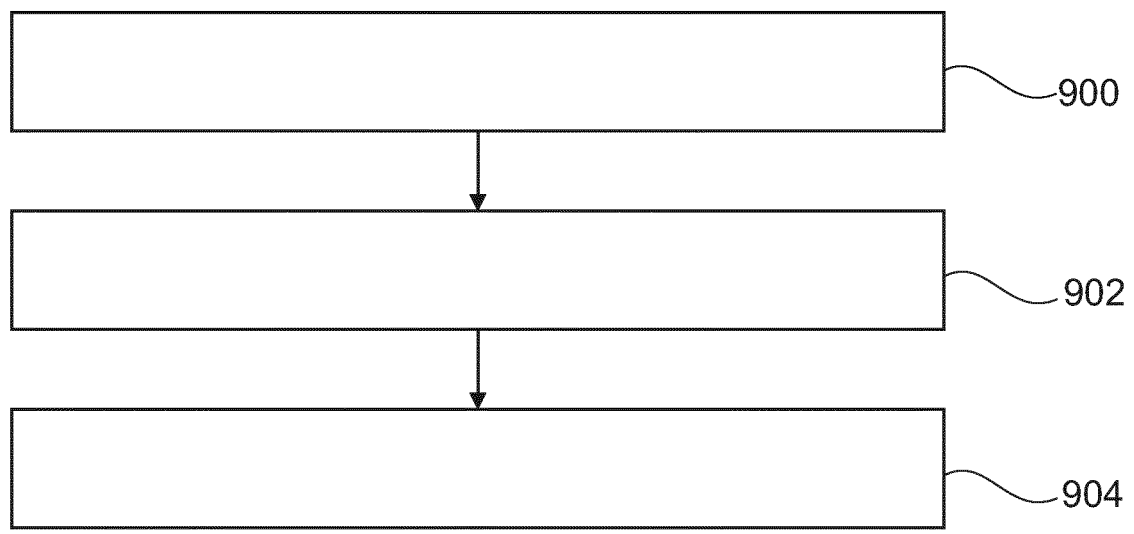
FIG. 9 shows a flow chart which illustrates an example of a method of operating the magnetic resonance imaging system of FIG. 8.

FIG. 9 shows a flowchart, which illustrates a method of operating the magnetic resonance imaging system 800 of FIG. 8. First in step 900 the magnetic resonance imaging system is controlled to generate a test B1 field using the elliptical transmission coil 114. Next in step 902 the magnetic field strength 812 is measured using the magnetic field sensor 804. Finally in step 904 the active B1 shim coil calibration 814 is calculated using the magnetic field strength measurement 812. The radio-frequency system, more specifically the transceiver 116, is configured for adjusting the amount of radio-frequency power supplied to the active B1 shim coil 118 using the active B1 shim coil calibration 814.

Any or all of the features of the magnetic resonance imaging systems of FIGS. 1, 7, and 8 may be combined with each other.

Two channel transmit systems, such as a two channel cylindrical body coil, may suffer from insufficient homogeneity performance e.g. for dedicated clinical spine and leg applications. It has been shown that even for 8 channel transmit systems (body coil with 8 inputs) with classical cylindrical coil element placement inhomogeneity issues remain. On the other hand local transmit arrays suffer from limited field of view or vastly increased complexity of costs and workflow when the desired volume is covered.

Examples may overcome the above mentioned problems by combination of body coil and local RF shim element(s) is proposed. While during B1 transmit the EM field of the local shim device superimposes with the transmit field of the body coil, during reception the shim device is actively switched to superimpose with a local receive coil. The shim device can consist of separate antenna device for transmit and receive. The local shim device is actively switched to change configuration between different modi.

In some examples, a switchable or autonomous switch may be implemented that functionally realizes the optimal configuration for both system modes, using no additional RF amplifiers.

One example takes via coupler RF energy from body coil and via switchable cable length, proper phase can be selected.

Some examples may be implemented in the patient bed, coil housing or patient mattress and/or combined with ceramic dielectric pads.

In some examples, the transmit phase, B1+ homogeneity, and SAR may be optimized whereas in receive state also B1-homogeniety and SNR is optimally increased.

In High field MRI, image quality often suffers from poor B1 field homogeneity and low SNR caused by wave propagation effects. A very pragmatic, simple and cheap solution to this problem is the use of dielectric pads, which can have a smoothing effect on the Transmit field. In a similar way, local active resonators can act similarly compared to dielectric pads, but in a better controllable manner. However these techniques can have disadvantages.

Simulations and experiments have shown, that by optimizing the transmit field which is related to that component circulating negatively around the B0-axis, the opposite field direction, which defines the receive sensitivity typically becomes smaller. This means, that optimizing the pads or resonators for transmit efficiency and homogeneity comes with reduced receive sensitivity and homogeneity.

Classical multi element transmit coil arrays with cylindrical element placement fail to create homogeneous B1 field in the spine region and e.g. for leg imaging.

Multi element transmit with 8 or more RF channels is difficult to handle and has a high cost due to the high power RF amplifiers and increased demands for calibration and workflow.

Two transmit channels for the system integrated MR body coil are not enough for dedicated clinical spine and leg application. To overcome and to reduce cost a local active shim device may be implemented, which is active in combination with the system integrated body coil.

Examples may integrate an active transmit and passive shim device. While during B1 transmit the electromagnetic field of the local shim device superimposes with the transmit field of the body coil, during reception the shim device is actively switched to superimpose with a local receive coil.

An example shim device (active B1 shim coil) can comprise a separate antenna device for transmit and receive.

In some examples, the local shim device (active B1 shim coil) can actively be switched to change configuration between different modes.

Further examples may implement a switchable or autonomous switch functionality to realize the optimal configuration for both system modes, using no additional RF amplifiers.

Normally channel coupling would prevent the simultaneous use of the body coil and local transmit elements. However, in some examples the number of local elements is restricted to a single element being placed centrally underneath the patient. In some examples, it has the furthermost distance to the body coil, reducing RF coupling, Furthermore, at this location patient loading dominates, again reducing the negative effects of coil coupling. Thirdly, recent developments shows that universal loading amplifiers are feasible, accepting strongly increased power coupling compared to the state of the art amplifiers.

One example supplied RF power to the B1 active shim coil using an RF coupler that uses RF energy from body coil. A switchable cable length is used to select the proper phase of the RF power supplied to the B1 active shim coil.

An example structure is implemented in the patient bed. Coil housing or patient mattress and/or combined with ceramic dielectric pads.

For transmit phase, B1+ homogeneity and SAR may be optimized, whereas in receive state also B1-homogeneity and SNR may be optimally increased.

FIGS. 10-14 show the results of a numerical simulation of the B1+ excitation field of a cylindrical body coil that is supplied with two transmit channels. The homogeneity is determined by a dielectric object and selected shim parameters at 0 and 270°.

Figure 10:
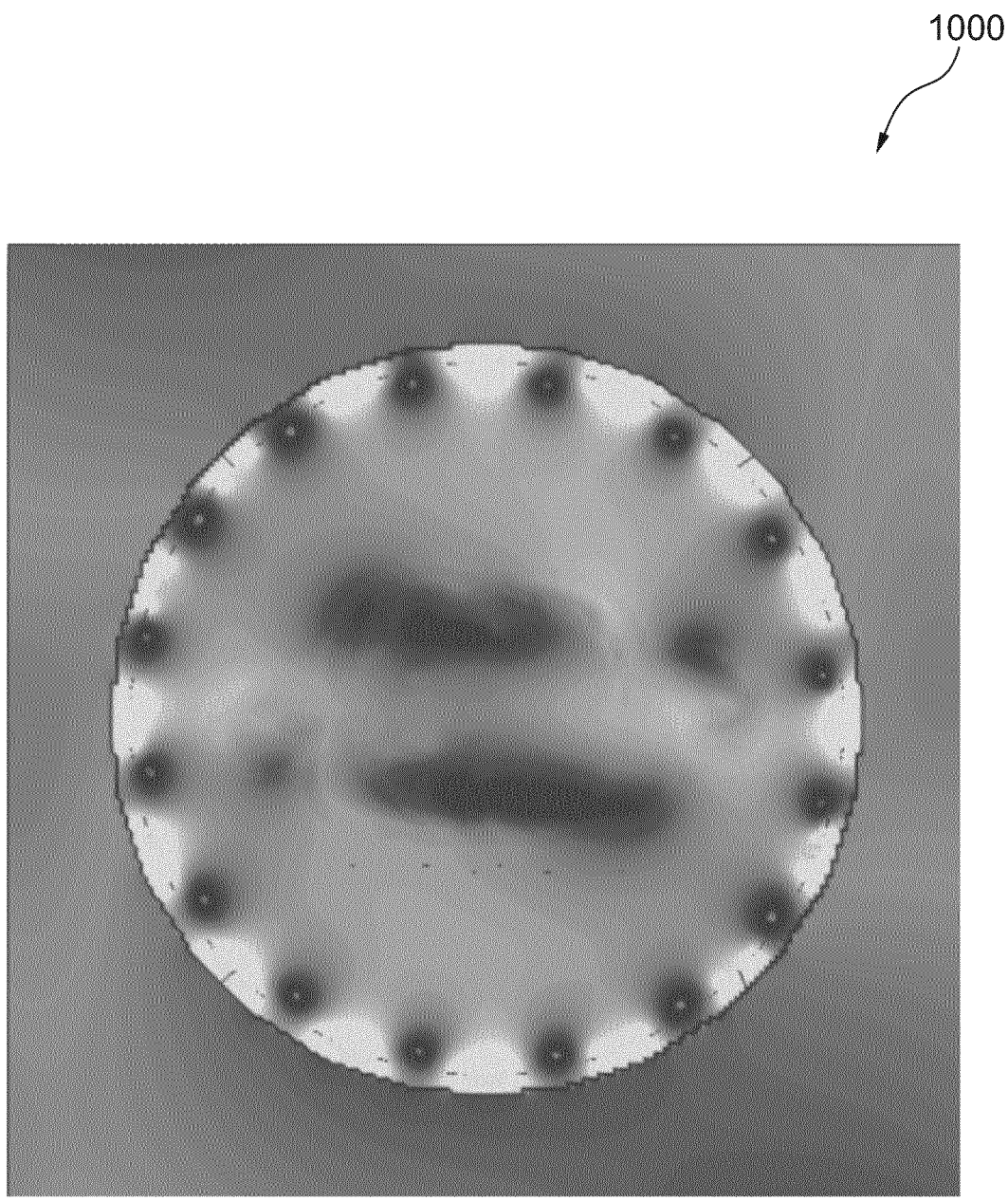
FIG. 10 shows results of an electromagnetic simulation of a cylindrical bird cage coil.

FIG. 10 shows a typical example when loading a body coil with a patient. The two signal voids (black, near the center) cannot be avoided by RF shimming with the two channels of the body coil. Moreover, in a large number of cases the best case shim result (most homogeneous) demands for a very asymmetric drive of the body coil with drive magnitudes differing by more than a factor of 3 (>9 in power). Then only one channel contributes to the spin excitation, where the other one is more or less unused. One option to overcome this is to place dielectric pads or local passive resonators to improve homogeneity. However, they are typically optimized only for one patient/application/FOV combinations and may have adverse effect for other scenarios. FIG. 10 shows a simulation of a two channel drive of a system integrated body coil of a MRI system. The homogeneity is determined by dielectric object and selected shim parameters (270 and 0 deg).

Figure 11:
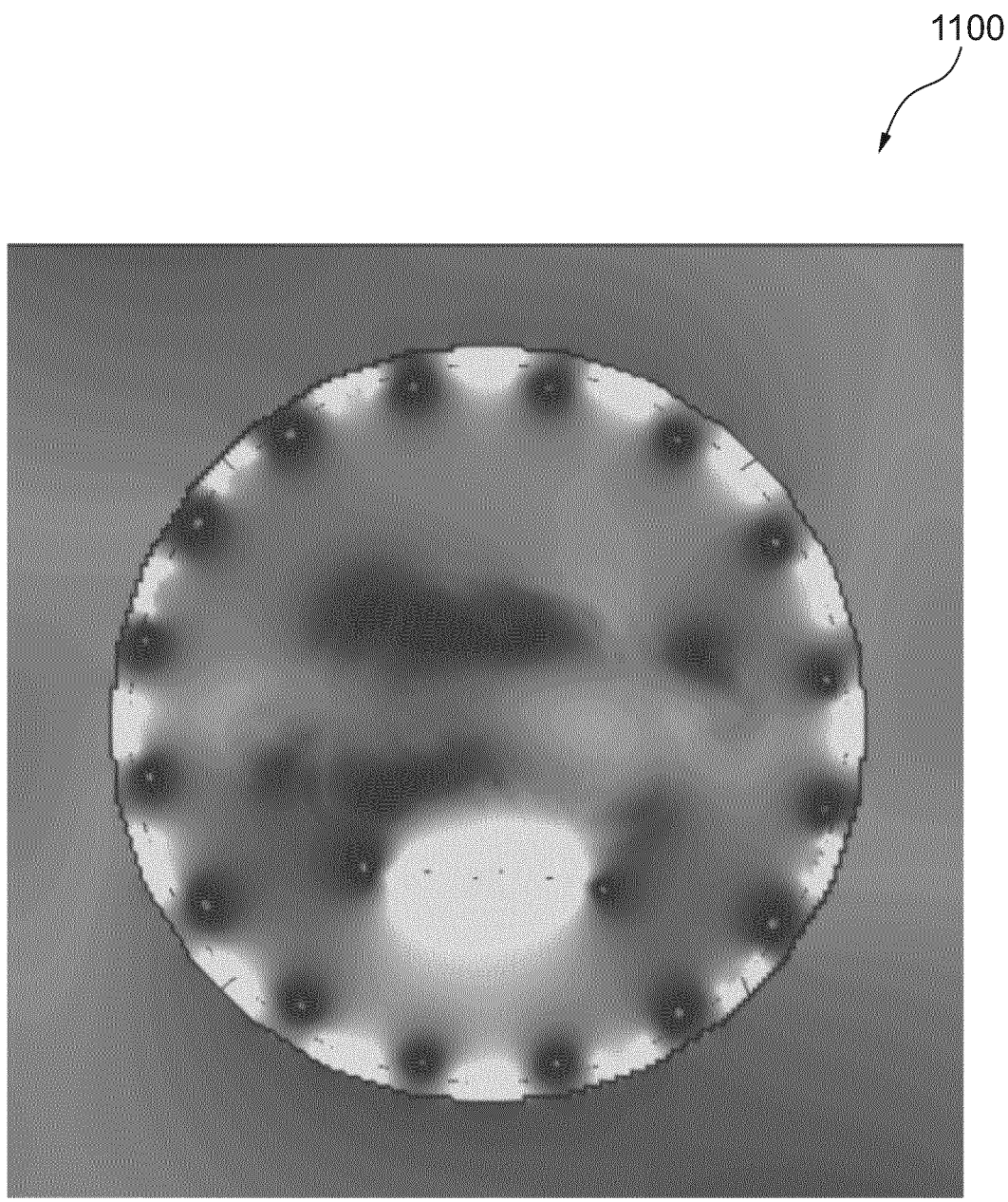
FIG. 11 shows further results of an electromagnetic simulation of a cylindrical bird cage coil.

FIG. 11 shows a calculation of the B1+ excitation field when there is a single channel active B1 booster coil. This can further influence the B1 inhomogeneity of the two channel drive of the cylindrical birdcage coil. It can be seen that the single active B1 shim coil counteracts the low B1+ excitation field adjacent to the presence of the active B1 shim coil. In FIG. 11, a local single channel active B1 booster can further influence the B1+ inhomogeneity of the 2-channel drive (0 deg).

Some examples may connect the unused RF amplifier to a rectangular local transmit device tailored to remove at least one of the signal voids occurring in body coil only excitation. (e.g. FIG. 11). Depending on the application and intended Field of View (FOV) phase and magnitude can be adjusted increasing the flexibility. Next to rectangular local coil elements, other shapes are possible as is illustrated in in FIGS. 12 and 13.

Figure 12:
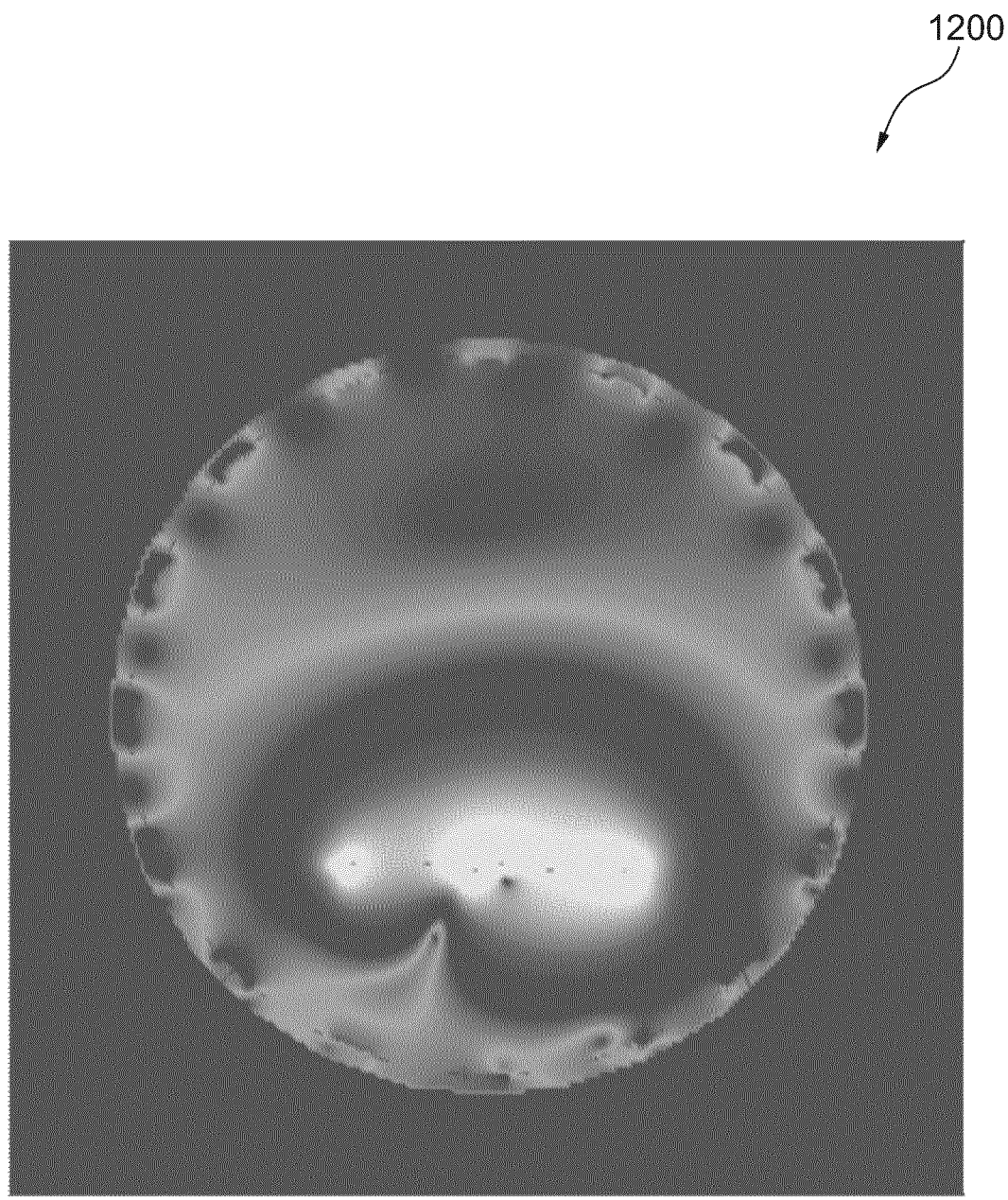
FIG. 12 shows further results of an electromagnetic simulation of a cylindrical bird cage coil.

FIG. 12 shows an image 1200 of the B1+ excitation field with the cylindrical body coil turned off. There is no human load or subject within the coil of FIG. 12. The B1+ excitation field is then purely due to the active B1 shim coil.

FIG. 12 shows an active 2 coil booster antenna within integrated body coil (switched off) of MR system. The homogeneity is determined by dielectric object and selected shim parameters (FIG. 13) with local active B1 booster (270 and 0 deg) and body coil switched on. BC 2-channel drive has same phase 270.0 deg.

Figure 13:
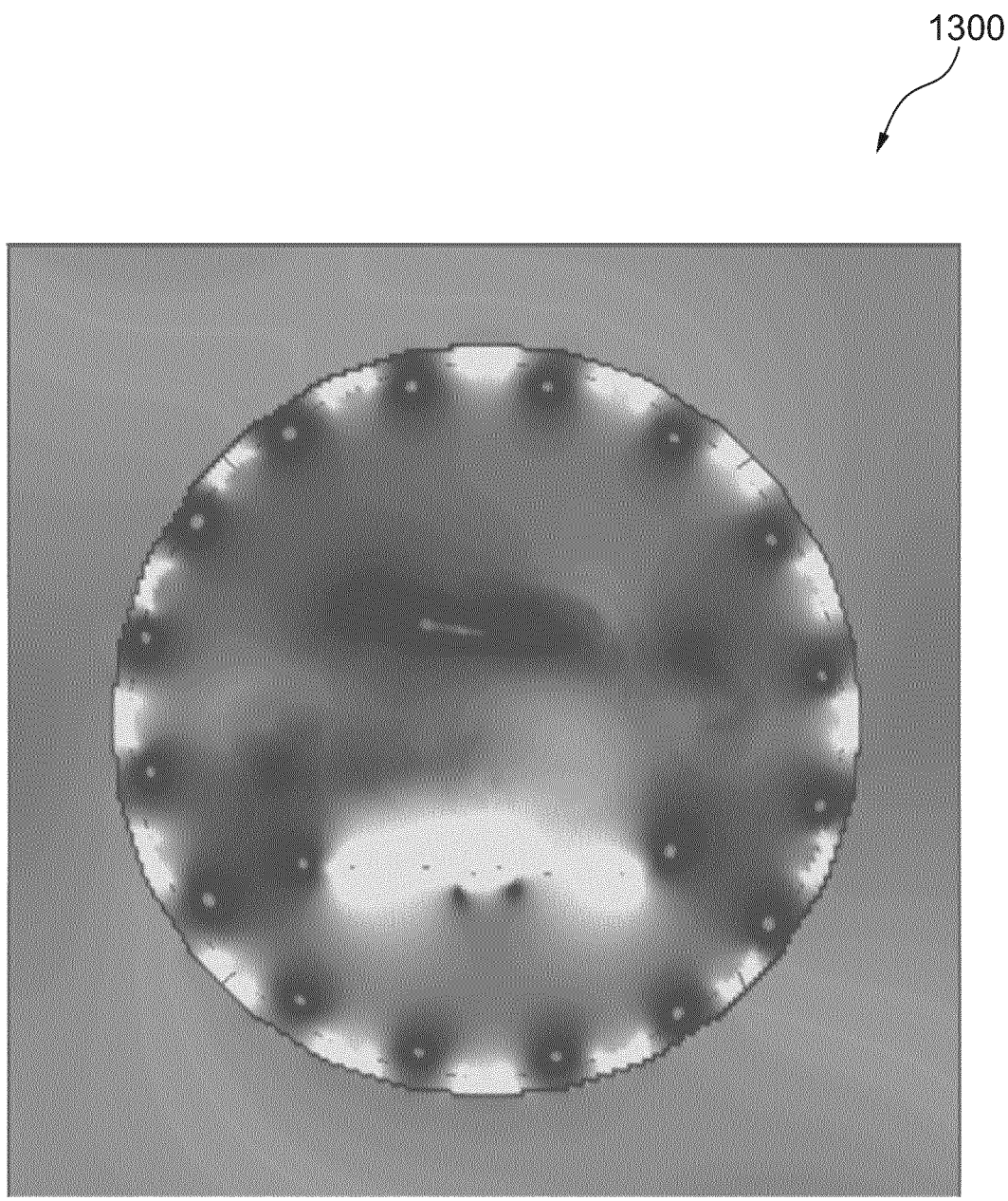
FIG. 13 shows further results of an electromagnetic simulation of a cylindrical bird cage coil.

The active RF booster device is located in the body coil for improvement of homogeneity and SAR in the MRI images. The switching of the active local RF booster can be performed by means of electric components such as PIN-diodes, Schottky-diodes or transistors. It can be solved passively or actively, thus the B1 transmit field FIG. 13 shows an image 1300 of the local active B1 shim coil with the birdcage coil loaded with a subject and also with the birdcage coil turned on. The grayscales in FIGS. 11, 12, and 13 are identical.

Figure 14:
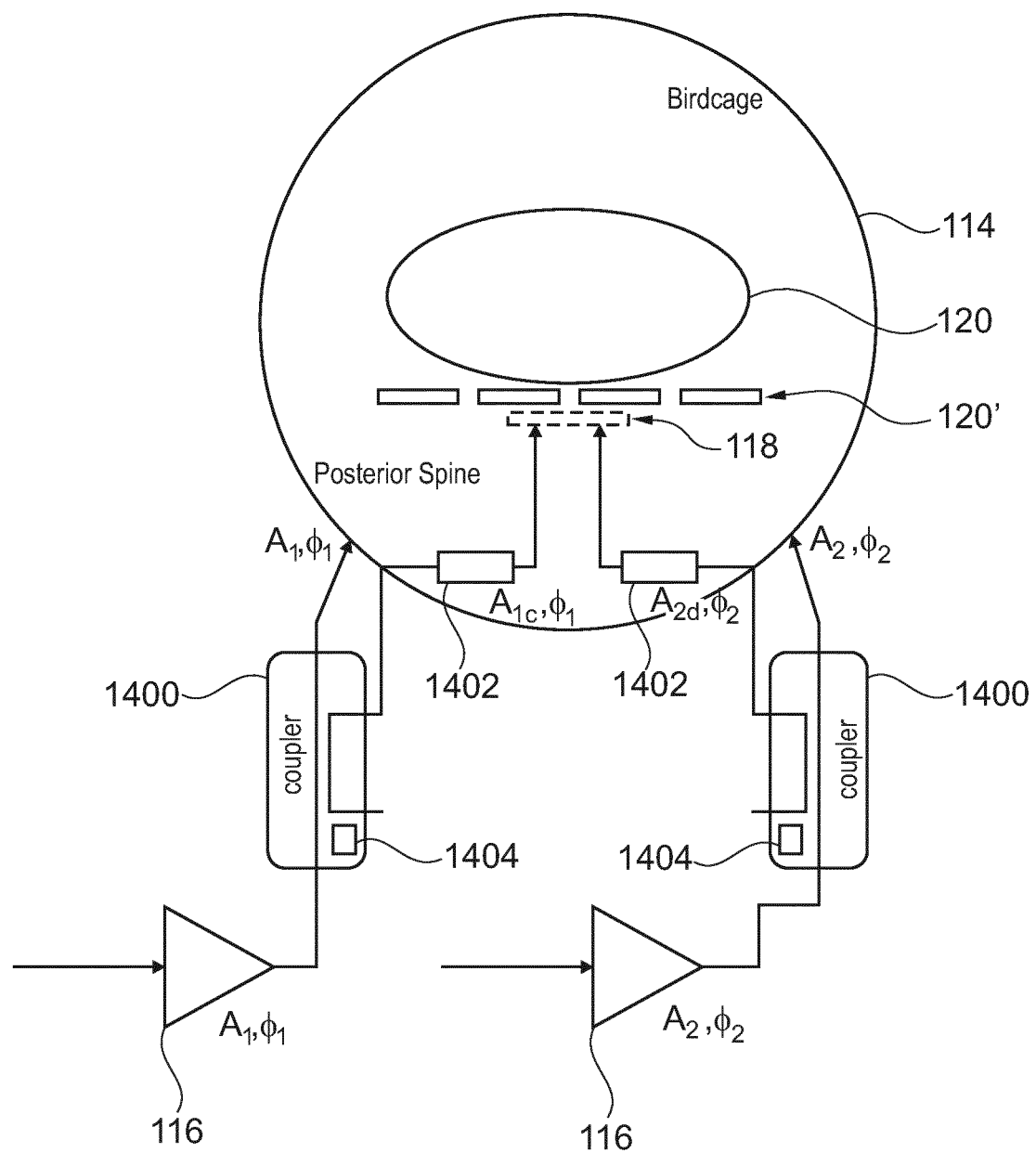
FIG. 14 illustrates an alternative radio frequency system for the magnetic resonance imaging systems of FIGS. 1, 7, and 8.

In FIGS. 1, 7, and 8 the transceiver 116 is shown as directly providing radio-frequency power to the active B1 shim coil 118. FIG. 14 shows an alternate configuration of the radio-frequency system. The example illustrated in FIG. 14 may be incorporated into the magnetic resonance imaging systems illustrated in FIGS. 1, 7, and 8.

In FIG. 14 the transceiver 116 supplies radio-frequency power to a cylindrical birdcage coil 114. The cylindrical birdcage coil has two input ports. Each of the input ports is connected to the transceiver via coupler 1400. The couplers 1400 take some of the radio-frequency power and divert it to the active B1 shim coil 118. The radio-frequency power is supplied to the active B1 shim coil 118 via tuning elements 1402. The tuning elements 1402 may enable the adjustment of the amplitude and/or phase of radio-frequency power supplied to the active B1 shim coil. This may enable controlling of the shimming of the B1+ excitation field. The active B1 shim coil 118 is shown as being adjacent to the posterior spine 120' of a subject 120. Placing the active B1 shim coil 118 adjacent to the spine may enable better imaging of the spine of the subject 120.

Power routing can be realized as shown in FIG. 14. There, the power distribution is realized by a coupler, another option is to use solid state RF switches instead, allowing to direct the power:

From the two amplifiers to the two body coil channels
From one amplifier to one body coil channel
To the local TX element only In FIG. 14, local active booster are shown for improved homogenization of the spine region of the human body. A standard 2-channel clinical MRI system is modified for improved homogeneity using couplers and phase shifters. During transmit the booster is active, while for reception, the booster may be switched for optimal coupling with the receive coil. For example FIG. 14, shows optional switching units 1404 for controllably coupling or decoupling the active B1 shim coil 118 from the transceiver. The switching units could for example by pass the coupler.

Figure 15:
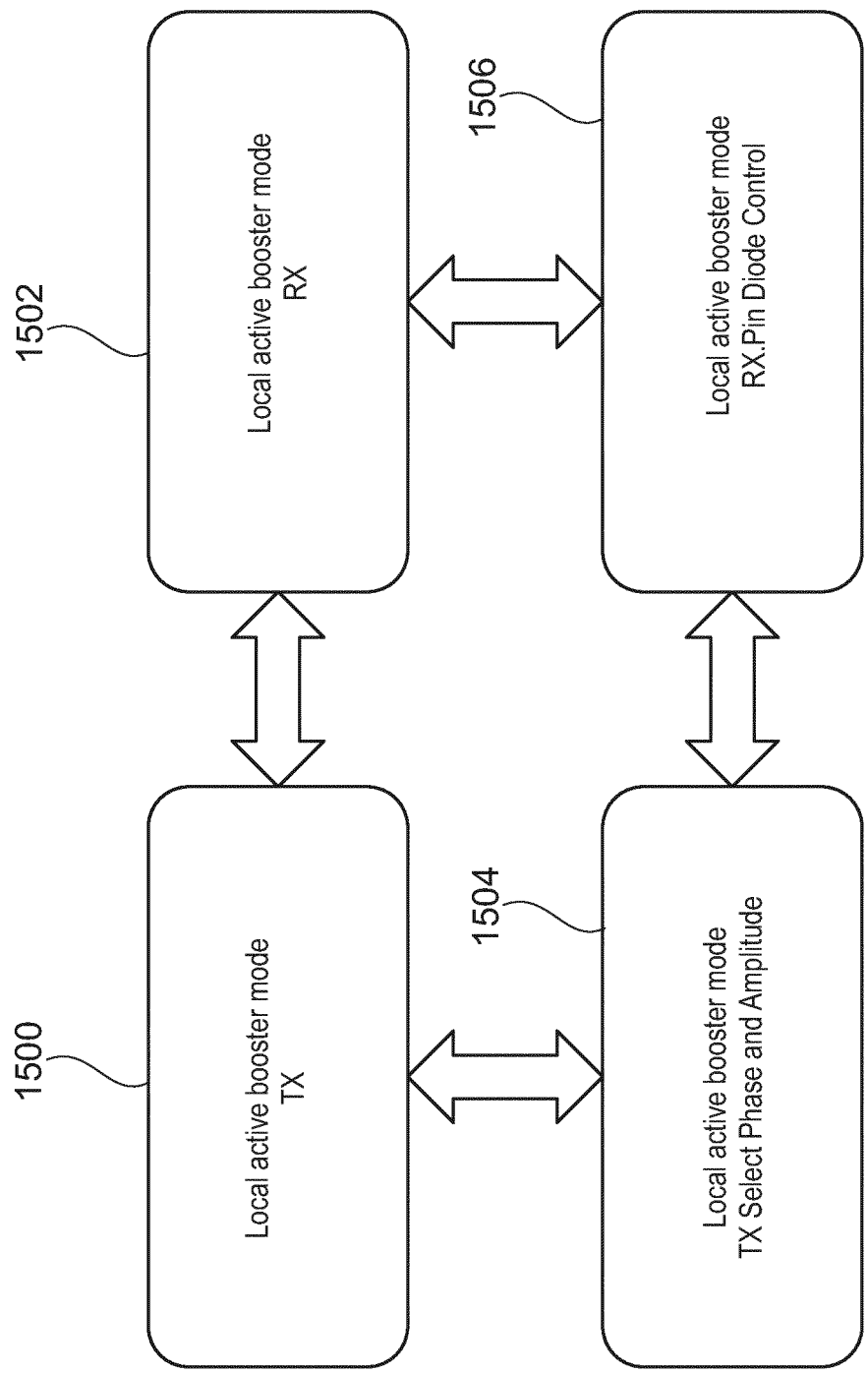
FIG. 15 illustrates several different operational modes of a radio-frequency system that comprises an elliptical transmission coil and an active B1 shim coil.

Examples may possibly be used in several different operational modes. This is illustrated in FIG. 15. In operational mode 1500 there is a local active booster mode for transmission. In this mode radio-frequency power is supplied to the active B1 shim coil. The next operational mode is mode 1502 where there is a local active booster mode during the reception of radio-frequency signals.

The next operational mode is a mode 1504. Mode 1504 is a local active booster mode in which during transmission the phase and amplitude can be selected. For example the tuning elements 1402 in FIG. 14 could be used. The final operational mode 1506 is a mode where there are local active boosters during reception and a pin diode is used to tune or detune the active B1 shim coil.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 eleptical transmission coil
116 transceiver
118 active B1 shim coil
120 subject
120' posterior spine
122 subject support
126 computer system
128 hardware interface
130 processor
132 user interface
134 computer memory
140 machine executable instructions
142 pulse sequence commands
144 magnetic resonance data
146 magnetic resonance image
200 loop coil
300 figure eight coil
400 dipole anteanna
500 folded dipole antenna
600 helical dipole antenna
700 magnetic resonance imaging system
702 passive B1 shimming element
800 magnetic resonance imaging system
802 tuning circuit
804 magneic field sensor
806 connection for a local receive coil
808 local receive coil
810 controller for active B1 shim coil
812 magnetic field strength measurement
814 active B1 shim coil calibration
900 control the magnetic resonance imaging system to generate a test B1 field using the elliptical transmission coil
902 measure a magnetic field strength during the generation of the test B1 field with the magnetic field sensor
904 calculate an active B1 shim coil calibration using the magnetic field strength, wherein the radio frequency system is configured for adjusting the amount of radio frequency power supplied to the active B1 shim coil using the active B1 shim coil calibration
1000 body human coil load
1100 body coil human load plus local booster SC
1200 local SC B1+ excitation with empty body coil off
1300 local SC B1+ excitation with loaded body coil on
1400 coupler
1402 tuning element
1404 switching unit
1500 local active booster mode transmit
1502 local active booster mode receive
1504 local active booster mode transmit select phase and amplitude
1506 local active booster mode transmit with PIN diode control for tuning circuit

The invention claimed is:

1. A magnetic resonance imaging system, comprising:
a main magnet configured for generating a B0 field in an imaging zone; and
a radio frequency system configured for acquiring magnetic resonance data from the imaging zone, wherein the radio frequency system is configured for sending and receiving radio frequency signals to acquire the magnetic resonance data, and wherein the radio frequency system comprises:
an elliptical transmission coil configured for generating a B1+ excitation field within the imaging zone;
an active B1 shim coil configured for being placed within the imaging zone, wherein the radio frequency system is configured for supplying radio frequency power to the active B1 shim coil during the generation of the B1+ excitation field by the elliptical transmission coil, wherein the active B1 shim coil is configured for shimming the B1+ excitation field within the imaging zone;
a transceiver configured to supply radio frequency power to the elliptical transmission coil via transmit channels; and
radio frequency couplers connected to the transmit channels for supplying radio frequency power to the active B1 shim coil,
wherein the elliptical transmission coil comprises one or more input ports, wherein each of the one or more input ports is connected to the transceiver via one of the radio frequency couplers, wherein the radio frequency couplers are configured to divert some of the radio frequency power to the active B1 shim coil via a tuning element which is configured to adjust at least one of the amplitude and phase of the radio frequency power supplied to the active B1 shim coil.

2. The magnetic resonance imaging system of claim 1, wherein the radio frequency system further comprises a connection for a local receive coil, wherein the active B1 shim coil comprises a tuning circuit for switching the active B1 shim coil between a tuned state and an untuned state, wherein the magnetic resonance imaging system further comprises:
- a memory for storing machine executable instructions, and
- a processor for controlling the magnetic resonance imaging system, wherein execution of the machine executable instructions causes the processor to control the tuning circuit to place the B1 shim coil in the tuned state when the elliptical transmission coil is generating the active B1+ excitation field during acquisition of the magnetic resonance data, wherein execution of the machine executable instructions further cause the processor to control the tuning circuit to place the active B1 shim coil in the untuned state when the connection for the local receive coil is configured for receiving the radio frequency signals during acquisition of the magnetic resonance data.

3. The magnetic resonance imaging system of claim 2, wherein the memory further contains pulse sequence commands configured for acquiring the magnetic resonance data according to a magnetic resonance imaging protocol, wherein execution of the machine executable instructions further causes the processor to control the magnetic resonance imaging system with the pulse sequence commands to acquire the magnetic resonance data.

4. The magnetic resonance imaging system of claim 2, wherein the radio frequency system is configured for adjusting an amount of radio frequency power and/or phase supplied to the active B1 shim coil.

5. The magnetic resonance imaging system of claim 4, wherein the active B1 shim coil comprises a magnetic field sensor, wherein execution of the machine executable instructions further causes the processor to:
- control the magnetic resonance imaging system to generate a test B1 field using the elliptical transmission coil;
- measure a magnetic field strength during the generation of the test B1 field with the magnetic field sensor; and
- calculate an active B1 shim coil calibration using the magnetic field strength, wherein the radio frequency system is configured for adjusting the amount of radio frequency power supplied to the active B1 shim coil using the active B1 shim coil calibration.

6. The magnetic resonance imaging system of claim 5, wherein the magnetic field sensor is formed at least partially from the active B1 shim coil.

7. The magnetic resonance imaging system of claim 1, wherein the active B1 shim coil is any one of the following: a loop coil, a FIG. 8 coil, a dipole antenna, a folded dipole antenna, and a helical dipole antenna.

8. The magnetic resonance imaging system of claim 1, wherein the active B1 shim coil is located in a central region of the imaging zone.

9. The magnetic resonance imaging system of claim 1, wherein the active B1 shim coil is any one of the following: located in the elliptical transmission coil, located in a subject mattress, located in a subject garment, and located within a subject support.

10. The magnetic resonance imaging system of claim 1, wherein a main or longest dimension of the active B1 shim coil is aligned with magnetic field lines of the B0 field.

11. The magnetic resonance imaging system of claim 1, wherein the elliptical transmission coil is any one of the following: a body coil, a head coil, a cylindrical transmission coil, a bird cage coil, a z-segmented combination of body coils, and a transverse electromagnetic (TEM) coil.

12. The magnetic resonance imaging system of claim 1, wherein the magnetic resonance imaging system further comprises at least one of; one or more resonant coupling coils for further shimming the B1+ excitation field within the imaging zone, preferably located between a region of interest in the imaging zone and the active B1 shim coil, further preferably located adjacent a side of the active B1 shim coil facing towards a region of interest of the imaging zone; and
- one or more dielectric pads for further shimming the B1+ excitation field within the imaging zone.

13. A method, comprising:
providing a magnetic resonance imaging system, wherein the magnetic resonance imaging system comprises:
- a main magnet configured for generating a B0 field in an imaging zone, and
- a radio frequency system configured for acquiring magnetic resonance data from the imaging zone, wherein the radio frequency system is configured for sending and receiving radio frequency signals to acquire the magnetic resonance data, and wherein the radio frequency system comprises:
  - an elliptical transmission coil configured for generating a B1+ excitation field within the imaging zone,
  - an active B1 shim coil configured for being placed within the imaging zone, wherein the radio frequency system is configured for supplying radio frequency power to the active B1 shim coil during the generation of the B1+ excitation field by the elliptical transmission coil, wherein the active B1 shim coil is configured for shimming the B1+ excitation field within the imaging zone, and wherein the active B1 shim coil comprises a tuning circuit for switching the active B1 shim coil between a tuned state and an untuned state,
  - a transceiver configured to supply radio frequency power to the elliptical transmission coil via transmit channels,
  - radio frequency couplers connected to the transmit channels for supplying radio frequency power to the active B1 shim coil, and
  - a connection for a local receive coil,
  - wherein the elliptical transmission coil comprises one or more input ports, wherein each of the one or more input ports is connected to the transceiver via one of the radio frequency couplers, and wherein the radio frequency couplers are configured to divert some of the radio frequency power to the active B1 shim coil via a tuning element which is configured to adjust at least one of the amplitude and phase of the radio frequency power supplied to the active B1 shim coil;
controlling the tuning circuit to place the active B1 shim coil in the tuned state when the elliptical transmission coil is generating the B1+ excitation field during acquisition of the magnetic resonance data; and
controlling the tuning circuit to place the active B1 shim coil in the untuned state when the connection for the local receive coil is configured for receiving the radio frequency signals during acquisition of the magnetic resonance data.

14. The method of claim 13, further comprising controlling the magnetic resonance imaging system with pulse sequence commands to acquire the magnetic resonance data, wherein the pulse sequence commands are configured for acquiring the magnetic resonance data according to a magnetic resonance imaging protocol.

15. The method of claim 13, further comprising adjusting an amount of radio frequency power and/or phase supplied to the active B1 shim coil.

16. The method of claim 15, wherein the active B1 shim coil comprises a magnetic field sensor, and wherein the method further comprises:
controlling the magnetic resonance imaging system to generate a test B1 field using the elliptical transmission coil;
measuring a magnetic field strength during the generation of the test B1 field with the magnetic field sensor; and
calculating an active B1 shim coil calibration using the magnetic field strength, wherein the radio frequency system is configured for adjusting the amount of radio frequency power supplied to the active B1 shim coil using the active B1 shim coil calibration.

17. The method of claim 16, providing the magnetic resonance system includes forming the magnetic field sensor at least partially from the active B1 shim coil.

18. The method of claim 13, providing the magnetic resonance system includes providing the active B1 shim coil is any one of the following: a loop coil, a FIG. 8 coil, a dipole antenna, a folded dipole antenna, and a helical dipole antenna.

19. The method of claim 13, wherein providing the magnetic resonance system includes locating the active B1 shim coil in a central region of the imaging zone.

* * * * *